US009728598B2

(12) United States Patent
Chen et al.

(10) Patent No.: US 9,728,598 B2
(45) Date of Patent: Aug. 8, 2017

(54) SEMICONDUCTOR DEVICE HAVING BARRIER LAYER TO PREVENT IMPURITY DIFFUSION (71) Applicant: TAIWAN SEMICONDUCTOR MANUFACTURING COMPANY, LTD., Taipei (TW)

(72) Inventors: I-Chih Chen, Taipei (TW); Chih-Mu Huang, Taipei (TW); Fu-Tsun Tsai, Taipei (TW); Meng-Yi Wu, Taipei (TW); Yung-Fa Lee, Taipei (TW); Ying-Lang Wang, Taipei (TW)

(73) Assignee: TAIWAN SEMICONDUCTOR MANUFACTURING CO., LTD., Taipei (TW)

( * ) Notice: Subject to any disclaimer, the term of this patent is extended or adjusted under 35 U.S.C. 154(b) by 53 days.

(21) Appl. No.: 14/681,045

(22) Filed: Apr. 7, 2015

(65) Prior Publication Data

US 2016/0300906 A1    Oct. 13, 2016

(51) Int. Cl.
*H01L 21/425*    (2006.01)
*H01L 21/02*    (2006.01)
*H01L 29/06*    (2006.01)
*H01L 29/66*    (2006.01)
*H01L 29/78*    (2006.01)
(Continued)

(52) U.S. Cl.
CPC ...... *H01L 29/0603* (2013.01); *H01L 29/0847* (2013.01); *H01L 29/66628* (2013.01); *H01L 29/66636* (2013.01); *H01L 29/7834* (2013.01); *H01L 29/7848* (2013.01); *H01L 21/26506* (2013.01)

(58) Field of Classification Search
CPC .................................................. H01L 29/0638
USPC .................. 438/514, 524, 526; 257/611, 498
See application file for complete search history.

(56) References Cited

U.S. PATENT DOCUMENTS 5,770,504 A * 6/1998 Brown .............. H01L 21/76237
27/115
7,544,582 B2 * 6/2009 Jung ................. H01L 21/76229
438/427

(Continued)

FOREIGN PATENT DOCUMENTS

| TW | 200828446 A | 7/2008 |
| TW | 201411841 A | 3/2014 |
| TW | 201445618 A | 12/2014 |

OTHER PUBLICATIONS

Office Action Taiwanese Patent Application No. 104138899dated Jan. 25, 2017.

*Primary Examiner* — Calvin Lee
(74) *Attorney, Agent, or Firm* — McDermott Will & Emery LLP (57) ABSTRACT

A semiconductor device includes a semiconductor substrate having a first conductivity type region including a first conductivity type impurity. A first gate structure is on the semiconductor substrate overlying the first conductivity type region. A second conductivity type region including a second conductivity type impurity is formed in the semiconductor substrate. A barrier layer is located between the first conductivity type region and the second conductivity type region. The barrier layer prevents diffusion of the second conductivity type impurity from the second conductivity type region into the first conductivity type region.

17 Claims, 7 Drawing Sheets (51) Int. Cl.
*H01L 29/08* (2006.01)
*H01L 21/265* (2006.01)

(56) References Cited

U.S. PATENT DOCUMENTS

| | | |
|---|---|---|
| 8,361,866 B2 | 1/2013 | Lee et al. |
| 8,487,378 B2 | 7/2013 | Goto et al. |
| 8,729,634 B2 | 5/2014 | Shen et al. |
| 8,826,213 B1 | 9/2014 | Ho et al. |
| 8,887,106 B2 | 11/2014 | Ho et al. |
| 9,490,160 B2 * | 11/2016 | Lee .................. H01L 21/76237 438/427 |
| 2013/0193521 A1 | 8/2013 | Lee et al. |
| 2014/0282326 A1 | 9/2014 | Chen et al. |

* cited by examiner

SEMICONDUCTOR DEVICE HAVING BARRIER LAYER TO PREVENT IMPURITY DIFFUSION

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, although existing FET devices and methods of fabricating FET devices have been generally adequate for their intended purposes, they have not been entirely satisfactory in all respects. For example, as the devices become smaller, leakage current paths between different conductivity type regions become a bigger problem.

BRIEF DESCRIPTION OF THE DRAWINGS

Aspects of the present disclosure are best understood from the following detailed description when read with the accompanying figures. It is noted that, in accordance with the standard practice in the industry, various features may not be drawn to scale. In fact, the dimensions of the various features may be arbitrarily increased or reduced for clarity of discussion.

DETAILED DESCRIPTION

The following disclosure provides many different embodiments, or examples, for implementing different features of the present disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Examples of devices that can benefit from one or more embodiments of the present disclosure are semiconductor devices. Such a device, for example, is a field effect transistor (FET). The FET device, for example, may be a complementary metal-oxide-semiconductor (CMOS) device comprising a p-type metal-oxide-semiconductor (PMOS) FET device and an n-type metal-oxide-semiconductor (NMOS) FET device. The following disclosure will include FET examples to illustrate various embodiments of the present application. It is understood, however, that the application should not be limited to a particular type of device, except as specifically claimed.

Figure 1:
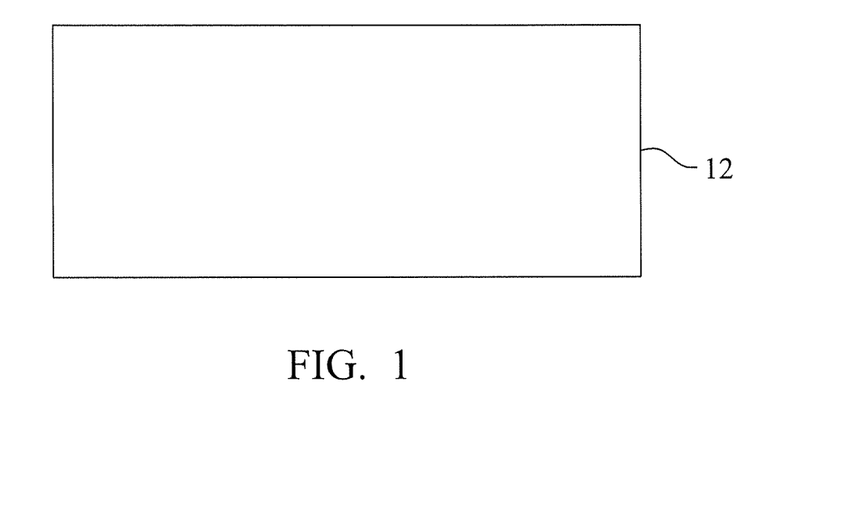
FIGS. 1-5 show an exemplary method for manufacturing a semiconductor device and a semiconductor device in accordance with an embodiment of the disclosure.

In an embodiment of the disclosure, a semiconductor substrate 12 including a first conductivity type impurity is provided, as shown in FIG. 1. In one embodiment, the semiconductor substrate 12 is a silicon substrate. Alternatively, the semiconductor substrate may include germanium, silicon germanium, gallium arsenide or other appropriate semiconductor materials. Also alternatively, the semiconductor substrate may include an epitaxial layer. For example, the semiconductor substrate may have an epitaxial layer overlying a bulk semiconductor. Further, the semiconductor substrate may be strained for performance enhancement. For example, the epitaxial layer may include a semiconductor material different from that of the bulk semiconductor, such as a layer of silicon germanium overlying bulk silicon or a layer of silicon overlying bulk silicon germanium. Such strained substrates may be formed by selective epitaxial growth (SEG). Furthermore, the semiconductor substrate may include a semiconductor-on-insulator (SOI) structure. Also alternatively, the semiconductor substrate may include a buried dielectric layer, such as a buried oxide (BOX) layer, such as that formed by separation by implantation of oxygen (SIMOX) technology, wafer bonding, SEG, or other appropriate method. In other embodiments, the substrate may comprise a compound semiconductor including IV-IV compound semiconductors such as SiC and SiGe, III-V compound semiconductors such as GaAs, GaP, GaN, InP, InAs, InSb, GaAsP, AlGaN, AlInAs, AlGaAs, GaInAs, GaInP, and/or GaInAsP; or combinations thereof.

The semiconductor substrate 12 includes an impurity. In some embodiments the conductivity type of the impurity is p-type. The p-type impurity may be boron, aluminum, or gallium in some embodiments.

Figure 2:
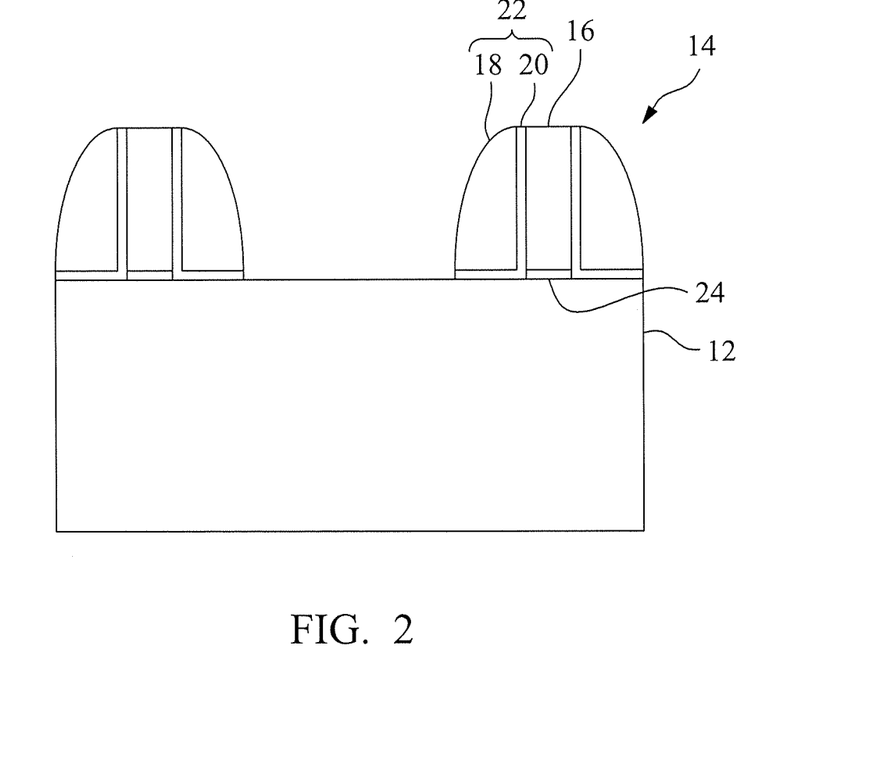

One or more gate structures 14 are formed over the semiconductor substrate in a certain embodiment, as shown in FIG. 2. The gate structures 14 include a gate electrode 16 formed over a gate dielectric layer 24. Insulating sidewall spacers 22 may be formed on sidewalls of the gate electrode 16. In some embodiments, the sidewall spacers 22 may comprise a plurality of layers 18, 20. In certain embodiments, the plurality of layers 18, 22 may formed of the same or different materials. For example, the inner layer 20 and outer layer 18 may be a silicon nitride layer. In alternate embodiments, the inner layer 20 may be thermal oxide layer formed by oxidizing the surface of gate electrode 16, and the outer layer 18 may be formed of a deposited silicon nitride. Other suitable materials for forming the sidewalls include silicon carbide and silicon oxynitride.

The gate dielectric 24 may comprise silicon oxide, silicon nitride, silicon oxynitride, high-k dielectric material, other suitable dielectric material, and/or combinations thereof. The gate electrode 16 may comprise any suitable material, such as polysilicon, aluminum, copper, titanium, tantalum, tungsten, molybdenum, tantalum nitride, nickel silicide, cobalt silicide, TiN, WN, TiAl, TiAlN, TaCN, TaC, TaSiN, metal alloys, other suitable materials, or combinations thereof.

In certain embodiments, the semiconductor device can be fabricated using a gate first method or a gate last method. In embodiments using a high-k gate dielectric layer and a metal gate (HK/MG), a gate last method is employed to form the gate electrode. In the gate last method, a dummy gate is formed, the dummy gate is subsequently removed at a later operation after a high temperature annealing operation, and the high-k gate dielectric layer and metal gate (HK/MG) are formed.

According to embodiments of the disclosure, the high k gate dielectric may comprise $HfO_2$, HfSiO, HfSiON, HfTaO, HMO, HfZrO, zirconium oxide, aluminum oxide, hafnium dioxide-alumina ($HfO_2$—$Al_2O_3$) alloy, other suitable high-k dielectric materials, or combinations thereof. The metal gate material may comprise one or more layers of Ti, TiN, titanium-aluminum alloy, Al, AlN, Ta, TaN, TaC, TaCN, TaSi, and the like.

In some embodiments, the sidewall spacers 22 can be used to offset subsequently formed doped regions, such as source/drain regions. The sidewall spacers 22 may further be used for designing or modifying the source/drain region (junction) profile. The sidewall spacers 22 may be formed by suitable deposition and etch techniques.

Figure 3:
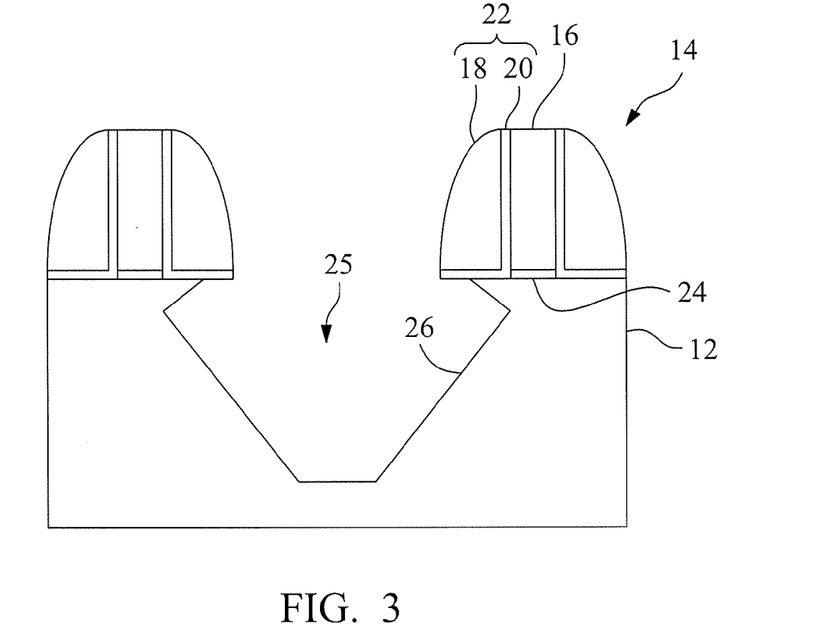

After forming the gate structures 14, the semiconductor substrate 12 may be etched to form a trench 25, as shown in FIG. 3. Any suitable etchant and etching technique can be used. The semiconductor substrate may be etched by various methods, including a dry etch, a wet etch, or a combination of dry etch and wet etch. The wet etching process may use a hot aqueous caustic, including potassium hydroxide (KOH), an aqueous solution of ethylene diamine and pyrocatechol (EDP), and tetramethylammonium hydroxide (TMAH). An acidic wet etchant, such as nitric acid ($HNO_3$)+ hydrofluoric acid (HF) can also be used. The dry etching process may implement fluorine-containing gas (e.g., $CF_4$, $SF_6$, $CH_2F_2$, $CHF_3$, and/or $C_4F_8$), chlorine-containing gas (e.g., $Cl_2$, $CHCl_3$, $CCl_4$, and/or $BCl_3$), bromine-containing gas (e.g., HBr and/or $CHBr_3$), oxygen-containing gas, iodine-containing gas, other suitable gases and/or plasmas, or combinations thereof. The etching process may include a multiple-step etching to gain etch selectivity, flexibility, and desired etch profile. In certain embodiments, TMAH is used to provide a diamond-shaped trench 25, as shown in FIG. 3. The semiconductor substrate 12 may be formed from silicon having an (110) orientation.

Figure 4:
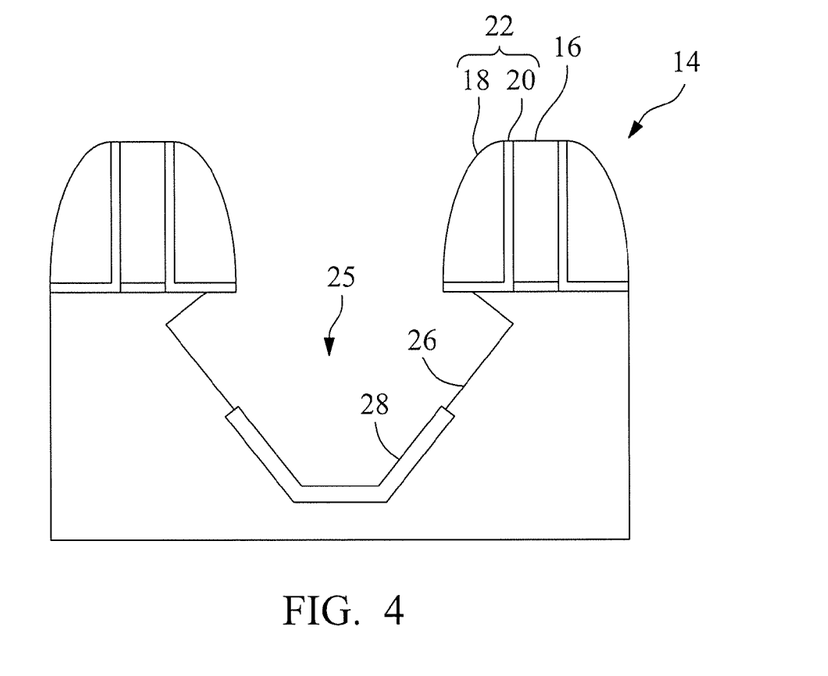

A barrier layer 28 is formed on walls 26 of the trench in certain embodiments of the present disclosure, as shown in FIG. 4. The barrier layer 28 can be formed by depositing a barrier layer material on the trench wall 26 or implanting a barrier dopant material in the trench wall 26. The barrier layer 28 blocks dopants in source/drain regions that are subsequently formed in the trench 25 from diffusing into the semiconductor substrate 12. The barrier layer 28 can be deposited by chemical vapor deposition (CVD) deposition techniques (e.g., vapor-phase epitaxy (VPE) and/or ultra-high vacuum CVD (UHV-CVD)), molecular beam epitaxy, atomic layer deposition (ALD), physical vapor deposition (PVD), sputtering, and/or other suitable processes. Alternatively, the barrier layer can be formed by ion implantation. The sidewall structures 22 can function as masks to define where the barrier layer 28 is formed. In certain embodiments, the barrier layer 28 is formed in a bottom portion of the trench 25, as shown in FIG. 4. In other embodiments, the barrier layer 28 lines a greater portion or substantially the entire trench wall 26.

The barrier layer 28 comprises carbon (C), nitrogen (N), or fluorine (F) in certain embodiments. In certain embodiments, the barrier layer 28 comprises C, N, or F as dopant. The concentration of the dopant may range from about $1\times10^{16}$ $cm^3$ to about $1\times10^{17}$ $cm^{-3}$. In certain embodiments, the barrier layer 28 is formed on the trench wall 26 and the dopant diffuses into the semiconductor substrate 12. Diffusion of dopant can be facilitated by a thermal annealing operation after the barrier layer 28 is formed on the trench wall 26. The C, N, and F dopant may be counter doped, and may constrain ions and reduce diffusion distance in certain embodiments.

Figure 5:
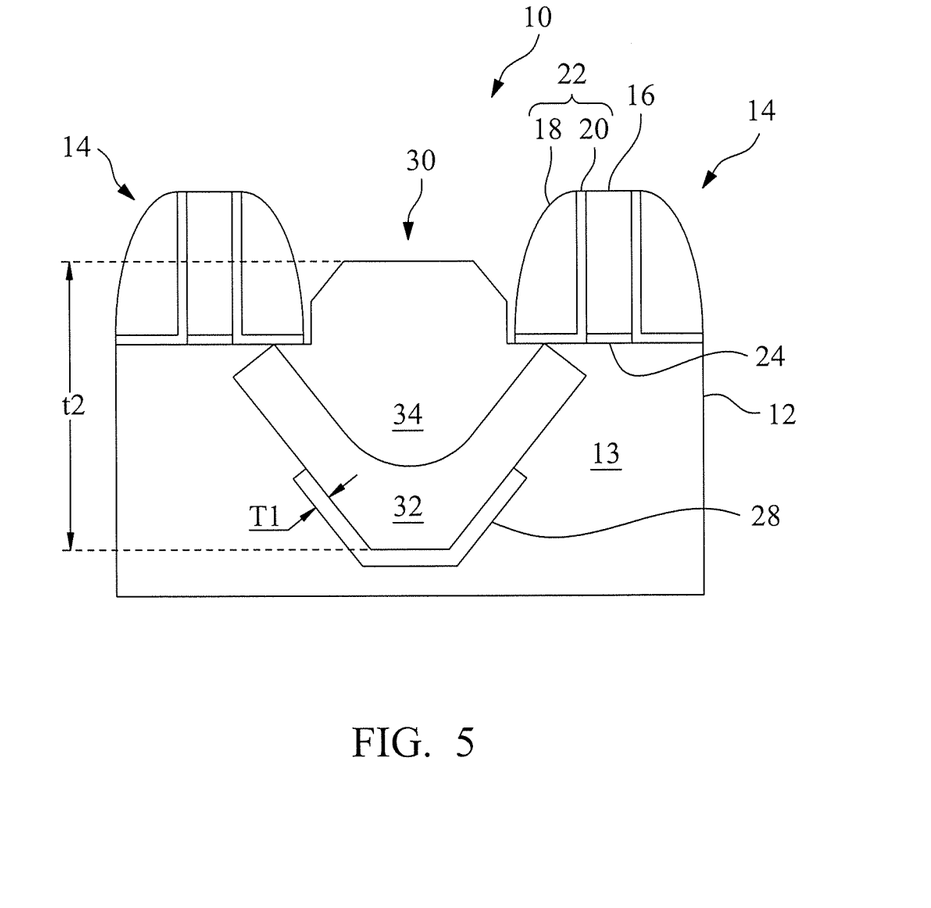

As shown in FIG. 5, a second conductivity type region 30 is formed in the trench 25, thereby providing a semiconductor device 10. The second conductivity type region 30 can be an epitaxial layer, and in certain embodiments is deposited by chemical vapor deposition (CVD) techniques (e.g., vapor-phase epitaxy (VPE) and/or ultra-high vacuum CVD (UHV-CVD)), molecular beam epitaxy, atomic layer deposition (ALD), physical vapor deposition (PVD), sputtering, and/or other suitable processes. In some embodiments, the second conductivity type region 30 includes a low impurity concentration portion 32 and a high impurity concentration portion 34. In certain embodiments, the second conductivity type region 30 may be a source or drain region. In some embodiments, the second conductivity type region 30 may be a raised source/drain region. The raised source/drain region may be a shared source/drain region, as illustrated in FIG. 5. In some embodiments, the conductivity type of the second conductivity type region 30 may be an n-type. Suitable n-type impurities include antimony (Sb), arsenic (As), or phosphorus (P).

As shown in FIG. 5, the semiconductor device 10 according to an embodiment of the present disclosure includes a semiconductor substrate 12 having a first conductivity type region 13 including a first conductivity type impurity. The gate structure 14 is formed on the semiconductor substrate 12 overlying the first conductivity type region 13. A second conductivity type region 30 includes a second conductivity type impurity formed in the semiconductor substrate 12. A barrier layer 28 is located between the first conductivity type region 13 and the second conductivity type region 30. The barrier layer 28 prevents diffusion of the second conductivity type impurity from the second conductivity type region 30 into the first conductivity type region 13.

In some embodiments, the impurity concentration in the high impurity concentration portion 34 of the second conductivity region 30 is about 10 times greater than the impurity concentration of the low impurity concentration portion 32. The impurity concentration in the low impurity concentration portion 32 may range from about $1\times10^{15}$ $cm^3$ to about $9\times10^{20}$ $cm^{-3}$. The impurity concentration in the high impurity concentration portion 34 may range from about $1\times10^{16}$ $cm^{-3}$ to about $9\times10^{21}$ $cm^{-3}$.

In some embodiments of the disclosure, the thickness t1 of the barrier layer ranges from about 0.5 nm to about 20 nm. The thickness t2 of the second conductivity type impurity region may range from about 2t1 to about 20t1. In some embodiments, the thickness t2 of the second conductivity region 30 ranges from about 5 nm to about 20 nm.

In another embodiment of the disclosure, a first and second gate structures 14 are formed adjacent each other overlying the first conductivity type region 13. A second conductivity type region 30 including a second conductivity type impurity is formed in the semiconductor substrate 12 between the first gate structure 14 and the second gate structure 14, thereby forming a shared source or drain region.

Figure 6:
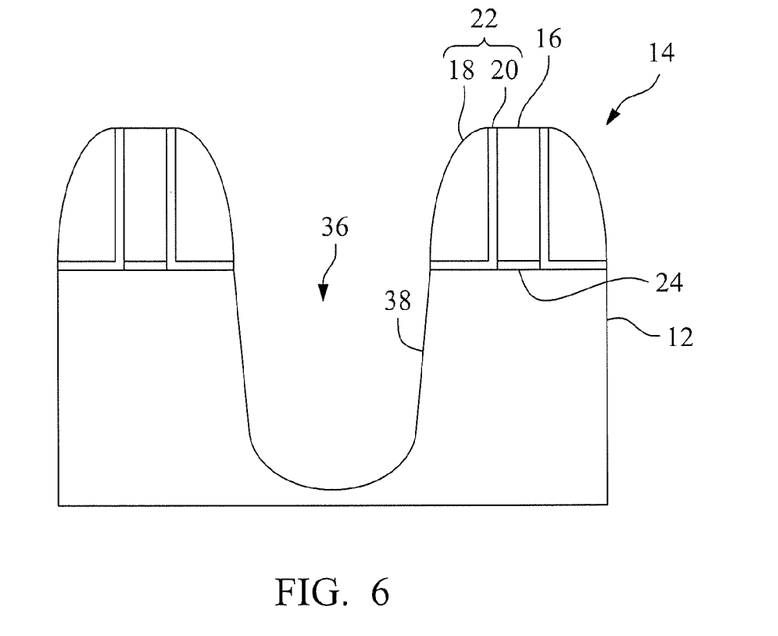
FIGS. 6-8 show an exemplary method for manufacturing a semiconductor device and a semiconductor device in accordance with an embodiment of the disclosure.
Figure 7:
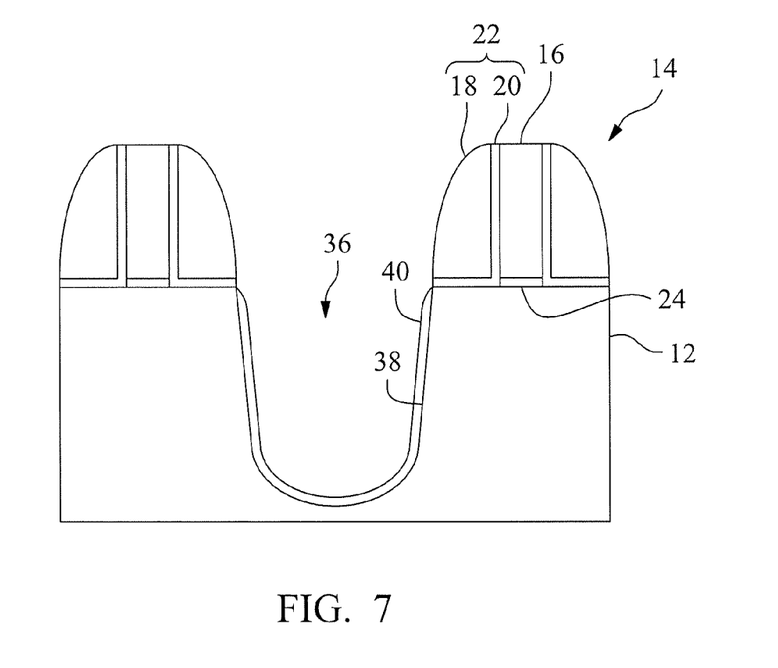
Figure 8:
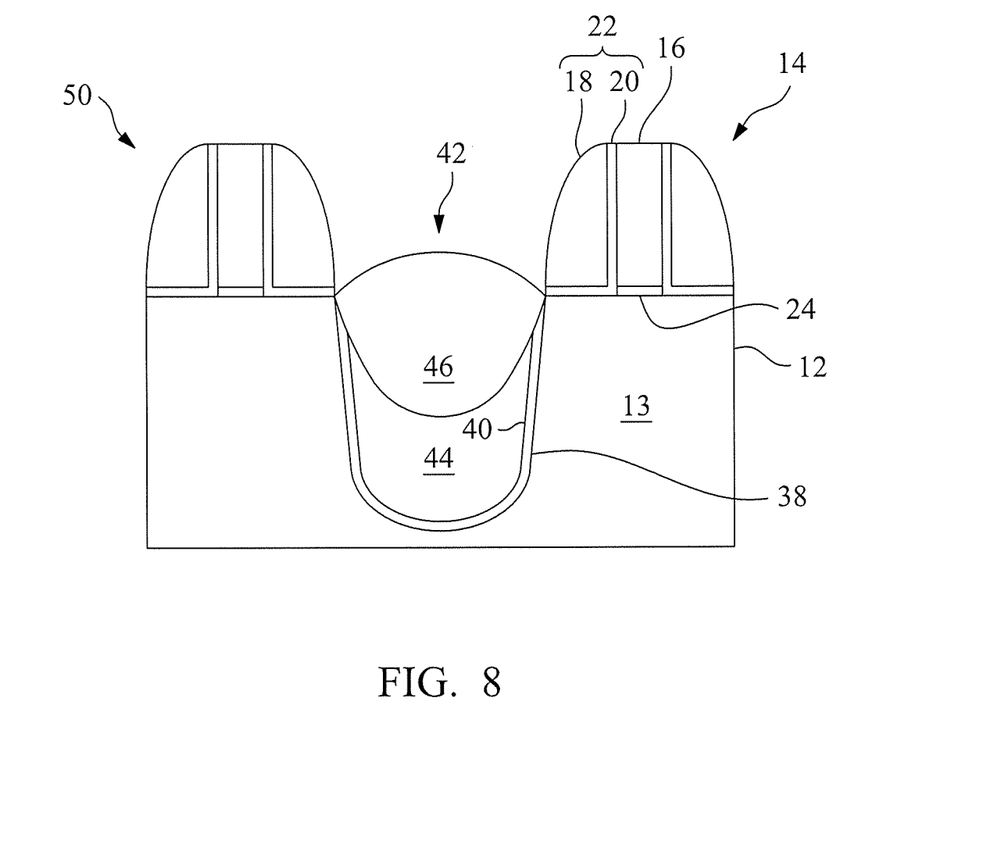

Any suitable trench shape and trench depth can be formed, in addition to the diamond shape trench 25 depending on the particular etchant type and etching operation. For example, a trench 36 with substantially vertical walls 38 can be formed by use of an anisotropic etching operation, as illustrated in FIG. 6. A barrier layer 40 is subsequently formed by a suitable deposition or implantation process, as shown in FIG. 7. A second conductivity type region 42 is deposited in the trench 36 thereby forming a semiconductor device 50, as shown in FIG. 8. In some embodiments, the second conductivity type region 42 includes a low impurity concentration portion 44 and a high impurity concentration portion 46.

Figure 9:
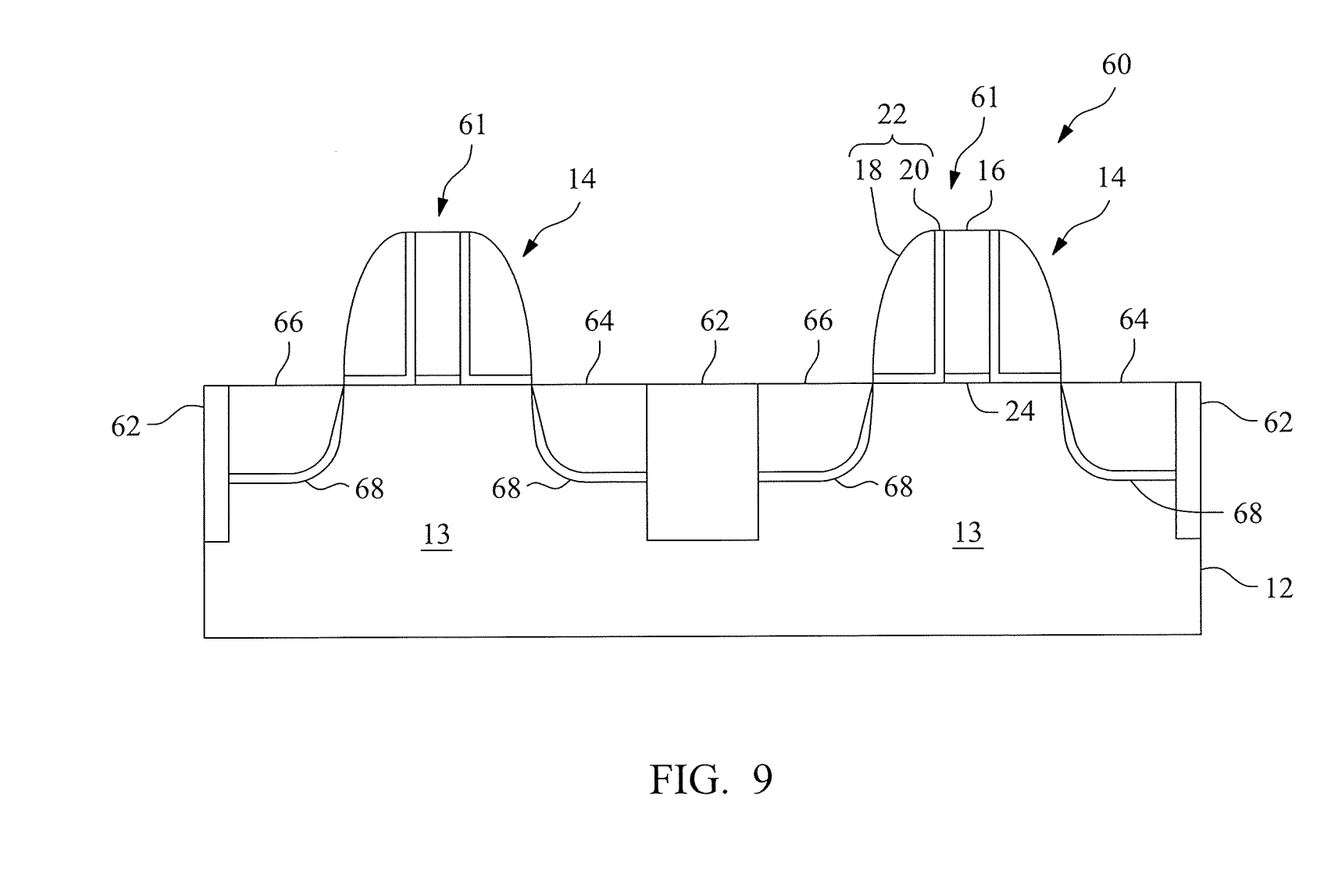
FIG. 9 illustrates a semiconductor device in accordance with an embodiment of the disclosure.

Adverting to FIG. 9, another embodiment of the disclosure is a semiconductor device 60 including a plurality of FETs 61 having source 64 and drain 66 regions on opposing sides of the gate structures 14. A barrier layer 68 is formed between the source 64 and drain 66 regions and the first conductivity type region 13. Shallow trench isolation (STI) regions 62 isolate adjacent field effect transistors 61.

The STI regions 62 may comprise silicon oxide, silicon nitride, silicon oxynitride, other suitable materials, and combinations thereof. STI regions may be formed by any suitable process. As one embodiment, the STI regions are formed by filling a trench between the field effect transistors with one or more dielectric materials by using a chemical vapor deposition (CVD). In some embodiments, the filled region may have a multi-layer structure such as a thermal oxide liner layer filled with silicon nitride or silicon oxide. An annealing process may be performed after the formation of the STI region. The annealing process includes rapid thermal annealing (RTA), laser annealing processes, or other suitable annealing processes.

In some embodiments, the STI regions are formed using flowable CVD. In the flowable CVD, flowable dielectric materials instead of silicon oxide are deposited. Flowable dielectric materials, as their name suggest, can "flow" during deposition to fill gaps or spaces with a high aspect ratio. Usually, various chemistries are added to silicon-containing precursors to allow the deposited film to flow. In some embodiments, nitrogen hydride bonds are added. Examples of flowable dielectric precursors, particularly flowable silicon oxide precursors, include a silicate, a siloxane, a methyl silsesquioxane (MSQ), a hydrogen silsesquioxane (HSQ), an MSQ/HSQ, a perhydrosilazane (TCPS), a perhydropolysilazane (PSZ), a tetraethyl orthosilicate (TEOS), or a silyl-amine, such as trisilylamine (TSA). These flowable silicon oxide materials are formed in a multiple-operation process. After the flowable film is deposited, it is cured and then annealed to remove un-desired element(s) to form silicon oxide. When the undesired element(s) is removed, the flowable film densities and shrinks. In some embodiments, multiple anneal processes are conducted. The flowable film is cured and annealed more than once at temperatures, such as in a range from about 1000° C. to about 1200° C., and for an extended period, such as 30 hours or more in total. In some embodiments, a chemical mechanical polishing (CMP) operation is performed to remove excess material from the STI region and to provide a substantially planar surface.

Figure 10:
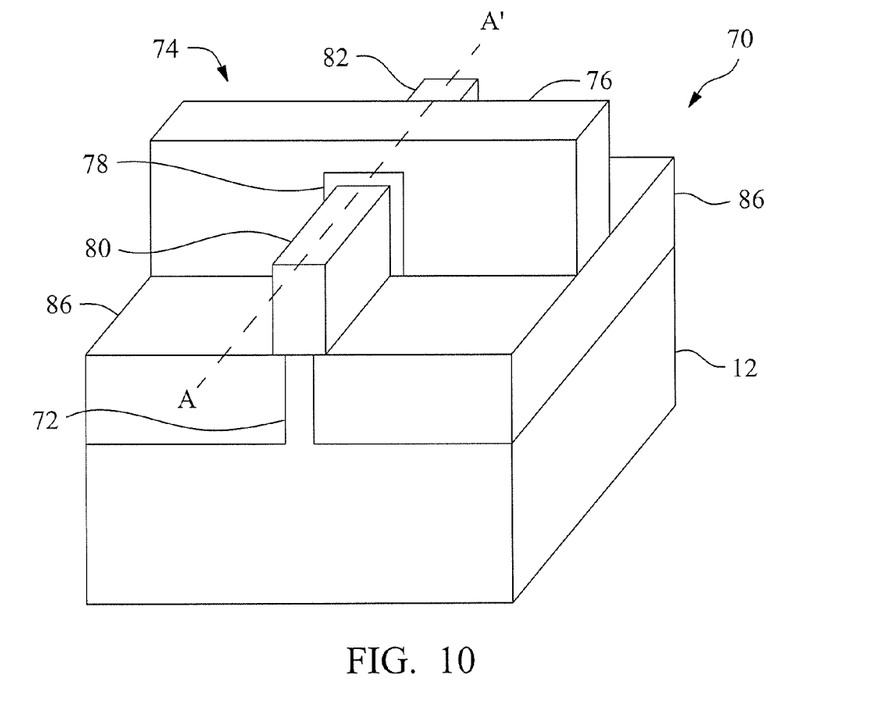
FIG. 10 is an isometric view of a semiconductor device in accordance with an embodiment of the disclosure.

As shown in FIG. 10, the semiconductor device is a fin-like field-effect transistor (Fin FET) 70 in certain embodiments. The Fin FET 70, includes a fin 72 formed on a semiconductor substrate 12. The fin 72 includes an impurity having a first conductivity type. A gate structure 74 formed on the fin 72 includes a gate electrode 76 overlying a gate dielectric 78. Source 80 and drain 82 regions of a second conductivity type are formed overlying the fin 72 on opposing sides of the gate electrode 76. STI regions 86 are formed on the semiconductor substrate 12 along lower portions of the fin 72.

Figure 11:
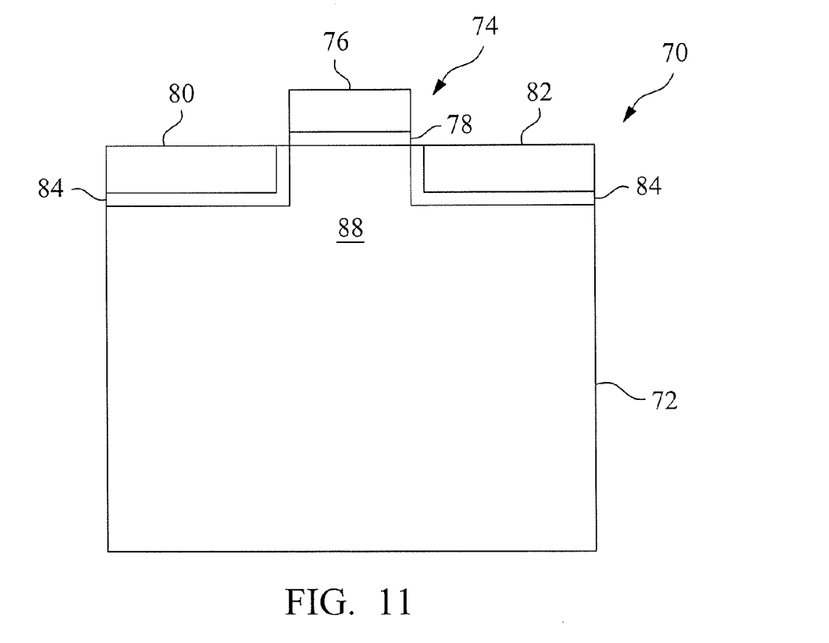
FIG. 11 is a cross section along line A-A' of FIG. 10 in accordance with an embodiment of the disclosure.

FIG. 11 is a cross section view taken along line A-A' showing the barrier layer 84 formed between the source 80 and drain 82 regions and the first conductivity type region 88 to prevent diffusion of impurities from the source 80 and drain 82 regions into the first conductivity type regions 88 of the fin 72.

The semiconductor device 70 is not limited to a single fin 72. In some embodiments, a semiconductor device includes a plurality of fins arranged substantially parallel to each other. In some embodiments, the source and drain regions of adjacent fins are in direct physical contact with respective neighboring drain source and drain regions.

In certain embodiments of the disclosure, a method for manufacturing a semiconductor device is provided. The method includes an operation of forming a barrier layer on or in a first conductivity type semiconductor substrate, and an operation of forming a second conductivity type region including a second conductivity type impurity in the semiconductor substrate so that the semiconductor substrate includes the second conductivity type region and the first conductivity type region. The barrier layer is between the second conductivity type region and the first conductivity type region, and the barrier layer prevents diffusion of the second conductivity type impurity from the second conductivity type region into the first conductivity type region.

In some embodiments, prior to the operation of forming the second conductivity type region, the semiconductor substrate is etched to form a trench at a region where the second conductivity type region is to be formed.

In some embodiments the barrier layer is formed on surfaces of the trench. The barrier layer includes carbon, nitrogen, or fluorine. The barrier layer may be formed by introducing impurities into the semiconductor substrate, and the impurities may be introduced by implantation.

In certain embodiments, the second conductivity type region is formed by an operation of depositing an epitaxial layer over the barrier layer.

Impurities can diffuse from a one conductivity type region to another conductivity type region in a semiconductor device. For example an n-type impurity, such as phosphorus, can diffuse from an n-type epitaxial region to a p-type well, thereby inducing a current leakage path. The prevention of leakage current paths is an important consideration as semiconductor device size shrinks. The leakage current can damage a semiconductor device.

Forming a barrier layer between a well of a first conductivity type and a source/drain region of a second conductivity type can prevent or decrease diffusion of the second conductivity type impurity into the first conductivity type well and thereby prevent leakage current paths from forming and subsequent damage to the semiconductor device. Thus, the barrier layer can improve device reliability. Forming the barrier layer on only the bottom portion of the source/drain regions has little or no impact on the resistance of the source and drain regions. Thus, forming the barrier layer between the source/drain regions and the well improves semiconductor reliability with little or no detrimental effect on device performance.

According to an embodiment of the disclosure, a semiconductor device includes a semiconductor substrate having a first conductivity type region including a first conductivity type impurity. A first gate structure is on the semiconductor substrate overlying the first conductivity type region. A second conductivity type region including a second conductivity type impurity is formed in the semiconductor substrate. A barrier layer is located between the first conductivity type region and the second conductivity type region. The barrier layer prevents diffusion of the second conductivity type impurity from the second conductivity type region into the first conductivity type region.

According to another embodiment of the disclosure, a semiconductor substrate has a first conductivity type region including a first conductivity type impurity. A first gate structure is on the semiconductor substrate overlying the first conductivity type region. A second gate structure is on the semiconductor substrate overlying the first conductivity type region and adjacent the first gate structure. A second conductivity type region including a second conductivity type impurity is formed in the semiconductor substrate between the first gate structure and the second gate structure. A barrier layer is located between the first conductivity type region and the second conductivity type region. The barrier layer prevents diffusion of the second conductivity type impurity from the second conductivity type region into the first conductivity type region.

According to yet another embodiment of the disclosure, a method for manufacturing a semiconductor device includes forming a barrier layer in a first conductivity type semiconductor substrate, and forming a second conductivity type region having a second conductivity type impurity in the semiconductor substrate so that the semiconductor substrate includes the second conductivity type region and the first conductivity type region. The barrier layer is between the second conductivity type region and the first conductivity type region, and the barrier layer prevents diffusion of the second conductivity type impurity from the second conductivity type region into the first conductivity type region.

As one of skill in the art would recognize some of the steps described in the above methods can be replaced or eliminated for other embodiments of the method.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor device comprising:
    etching a first conductivity type semiconductor substrate to form a trench in the semiconductor substrate;
    forming a barrier layer on a surface of the trench in the semiconductor substrate;
    forming a second conductivity type region comprising a second conductivity type impurity in the trench over the barrier layer,
    wherein the barrier layer is between the second conductivity type region and the first conductivity type region, and the barrier layer prevents diffusion of the second conductivity type impurity from the second conductivity type region into the first conductivity type region.

2. The method according to claim 1, wherein the forming a second conductivity type region comprises depositing an epitaxial layer over the barrier layer.

3. The method according to claim 1, wherein the barrier layer is formed by introducing impurities into the semiconductor substrate.

4. The method according to claim 1, wherein the barrier layer comprises carbon, nitrogen, or fluorine.

5. A semiconductor device comprising:
    a semiconductor substrate having a first conductivity type region including a first conductivity type impurity;
    a first gate structure on the semiconductor substrate overlying the first conductivity type region;
    a second conductivity type region including a second conductivity type impurity formed in the semiconductor substrate; and
    a barrier layer located between the first conductivity type region and the second conductivity type region,
    wherein the second conductivity type region includes a low impurity concentration portion and a high impurity concentration portion having a higher impurity concentration than the low impurity concentration portion, and the low impurity concentration portion is between the high impurity concentration portion and the barrier layer.

6. The semiconductor device of claim 5, wherein the barrier layer comprises C, N, or F as dopant.

7. The semiconductor device of claim 5, wherein the impurity concentration in the low impurity concentration portion ranges from about $1\times10^{15}$ cm$^{-3}$ to about $9\times10^{20}$ cm$^{-3}$ and the impurity concentration in the high impurity concentration portion ranges from about $1\times10^{16}$ cm$^{-3}$ to about $9\times10^{21}$ cm$^{-3}$.

8. The semiconductor device of claim 7, wherein the concentration of the dopant ranges from about $1\times10^{16}$ cm$^{-3}$ to about $1\times10^{17}$ cm$^{-3}$.

9. A semiconductor device comprising:
    a semiconductor substrate having a first conductivity type region including a first conductivity type impurity;
    a first gate structure on the semiconductor substrate overlying the first conductivity type region;
    a second conductivity type region including a second conductivity type impurity formed in the semiconductor substrate; and
    a barrier layer located between and is in direct contact with the first conductivity type region and the second conductivity type region,
    wherein the barrier layer prevents diffusion of the second conductivity type impurity from the second conductivity type region into the first conductivity type region, and
    wherein the second conductivity type region includes a first portion and a second portion, wherein the second portion contains a higher concentration of the second conductivity type impurity than the first portion.

10. The semiconductor device of claim 9, wherein the barrier layer comprises carbon, nitrogen, or fluorine.

11. The semiconductor device of claim 9, wherein the first conductivity type is p-type and the second conductivity type is n-type.

12. The semiconductor device of claim 9, wherein the second conductivity type impurity is phosphorus.

13. The semiconductor device of claim 9, wherein a thickness t1 of the barrier layer ranges from about 0.5 nm to about 20 nm.

14. The semiconductor device of claim 9, wherein a thickness t2 of the second conductivity type impurity region ranges from about 2t1 to about 20t1.

15. The semiconductor device of claim 9, wherein the semiconductor device is a fin-like field-effect transistor.

16. The semiconductor device of claim 9, wherein the second conductivity type region is a source or drain region.

17. The semiconductor device of claim 16, wherein the source and drain regions are raised source and drain regions.

* * * * *